United States Patent [19]

Hunsperger et al.

[11] 3,914,784

[45] Oct. 21, 1975

[54] ION IMPLANTED GALLIUM ARSENIDE SEMICONDUCTOR DEVICES FABRICATED IN SEMI-INSULATING GALLIUM ARSENIDE SUBSTRATES

[75] Inventors: Robert G. Hunsperger, Malibu; Nathan Hirsch, Santa Monica, both of Calif.

[73] Assignee: Hughes Aircraft Company, Culver City, Calif.

[22] Filed: Dec. 10, 1973

[21] Appl. No.: 423,325

[52] U.S. Cl. ........................ 357/61; 357/15; 357/63

[51] Int. Cl.$^2$ ............... H01L 29/48; H01L 29/161; H01L 29/167

[58] Field of Search ............. 357/15, 91, 61, 63, 90

[56] References Cited

UNITED STATES PATENTS 3,649,369 3/1972 Hunsperger et al. ............... 317/235

3,666,567 5/1972 Hunsperger et al. ............... 317/235

OTHER PUBLICATIONS

Sansbury et al., *Radiation Effects,* 1970, Vol. 6, p. 269.

IBM, Tech. Bul., Vol. 11, No. 4, Sept. 1968, Statz.

IBM, Tech. Bul., Vol. 9, No. 1, June 1966, De Witt.

*Primary Examiner*—John S. Heyman

*Assistant Examiner*—E. Wojciechowicz

*Attorney, Agent, or Firm*—William J. Bethurum; W. H. MacAllister

[57] ABSTRACT

Electrically isolated active device regions are fabricated in GaAs semi-insulating wafers by the implantation therein of sulphur ions. The implanted wafers are then coated with a passivating oxide and annealed at an elevated temperature of 800°C or greater in order to achieve carrier mobilities in excess of 3000 $cm^2$volt-second.

8 Claims, 34 Drawing Figures

ION IMPLANTED GALLIUM ARSENIDE SEMICONDUCTOR DEVICES FABRICATED IN SEMI-INSULATING GALLIUM ARSENIDE SUBSTRATES

FIELD OF THE INVENTION

This invention relates generally to ion implanted gallium arsenide semiconductor wafers and devices and particularly to the fabrication of such devices in semi-insulating gallium arsenide substrates. In an even more specific aspect, the present invention resides in the fabrication of an ion implanted Schottky-gate field effect transistor exhibiting an improved cutoff frequency $F_{max}$. The novel process described herein is characterized by an improved device yield per wafer.

BACKGROUND

Semi-insulating gallium arsenide substrates have been previously used in the fabrication of a number of semiconductor devices. In addition to providing the "handle" necessary in batch processing of semiconductor devices, these substrates are frequently utilized as the means for supporting a plurality of adjacent components fabricated side by side in an epitaxial extension of the gallium arsenide substrate. This GaAs substrate must necessarily be a single crystal structure in cases where a GaAs epitaxial layer is formed thereon in the device fabrication process. Additionally, the semi-insulating resistivity of the GaAs substrate is typically on the order of $10^7$–$10^8$ ohm. centimeters, and such high resistivities may be achieved by introducing chromium or oxygen into the GaAs melt from which the substrates are grown. Actually, GaAs substrates exhibiting a bulk resistivity anywhere within the range of $10^6$–$10^8$ ohm. centimeters would be acceptable for use in the present process where the substrate is used as a common support and an electrical isolation medium for epitaxial GaAs devices.

GaAs semi-insulating substrates have been commercially available for many years. Since these substrates were, in the past, never directly doped to form active device regions, the specific amount of the chromium or oxygen dopant introduced in the GaAs melt was not considered to be particularly important. The dopant quantities of chromium or oxygen were required to be sufficient to raise the resistivity of the substrate thus produced from an undoped level on the order of $10^{14}$ carriers/cc to some level approaching the intrinsic resistivity of the GaAs, i.e., something on the order of $10^8$ or $10^9$ carriers/cc.

Because of the presence of either chromium or oxygen in semi-insulating GaAs substrates, and possibly because of the generally unspecified and normally unknown amount of such dopant in the GaAs crystal, it was generally felt by those skilled in the art that semiconductor devices of commercially acceptable quality could not be made by introducing impurities directly into the semi-insulating substrates. It was generally believed by workers in the art that the presence of chromium atoms, in the GaAs crystal for example, would unduly decrease carrier mobilities in the substrate and therefore would not permit the fabrication of commercially acceptable semiconductor devices therein. Chromium produces defect centers in the GaAs crystal which act as deep level traps in the GaAs band gap. These traps tend to unacceptably limit the carrier mobilities and to degrade the gain-versus-frequency characteristic of devices produced in the GaAs. This is true unless steps are taken to carefully limit the chromium or oxygen dopant levels to only those amounts necessary to produce a semi-insulating bulk resistivity on the order of $10^6$–$10^8$ ohm. centimeters.

In the past, the generally accepted practice of making GaAs semiconductor devices and integrated circuits utilizing semi-insulating GaAs substrates was to epitaxially deposit a layer of lower resistivity GaAs material on the semi-insulating GaAs substrate and then to further treat this epitaxial layer in order to form active device regions. For example, in the fabrication of certain types of GaAs field-effect transistors, active device regions are formed in a GaAs epitaxial layer which is an extension of the semi-insulating GaAs substrate. Thus, in the fabrication of field effect transistor regions in the GaAs epitaxial layer, it didn't make any difference what the chromium doping levels in the underlying GaAs substrate was, so long as the substrate was semi-insulating to prevent undesirable current leakage between adjacent epitaxial islands or mesas.

PRIOR ART

One well known type of GaAs semiconductor device utilizing a very high resistivity semi-insulating substrate is the Schottky-barrier-gate GaAs field effect transistor. This device is described, for example, by S.M.Sze in *Physics of Semiconductor Devices*, John Wiley, 1969, at page 410. These Schottky-barrier-gate devices are used, for example, as low noise microwave transistors, and they are also described in the "International Microwave Journal" November 1972, Vol. 15, No. 11 at page 15. The Schottky-barrier-gate devices described in these two publications noted above utilize a GaAs epitaxial layer for the material in which the field effect transistor gate, channel and source and drain regions are formed. These devices have, in general, proved satisfactory in their intended operation. However, this particular type of layered FET structure frequently results in unacceptably low gain and high noise, in nonuniformity in the gain-versus-frequency characteristics from device to device fabricated in a single batch process, and in unacceptable variation in the D.C. operating bias point from device to device. All of these deficiencies result from the basic problem of non uniformity of both epitaxial layer carrier concentration and epitaxial layer thickness over the area of the epitaxial layer.

Schottky-barrier-gate field effect devices have also been fabricated in silicon as well as GaAs. Silicon has a lower band gap energy and a lower mobility than GaAs, so that generally speaking, silicon FET devices do not operate at as high frequencies as their GaAs counterparts. Furthermore, to date it has not been possible to raise the resistivity of silicon substrates higher than about $10^4$ ohm. centimeters, which is about 4 orders of magnitude less than the bulk resistivity of the semi-insulating GaAs substrates. An example of a Schottky-barrier-gate silicon field effect transistor is disclosed in U.S. Pat. No. 3,725,136 issued to I. H. Morgan on Apr. 13, 1973. However, because of the fact that Morgan's silicon substrate is not semi-insulating, conventional PN junction isolation must be used in the construction of this device. And the frequency range of such a device is inherently limited by the junction capacitance associated with such PN junction electrical isolation.

While the above prior art epitaxial GaAs Schottky-barrier-gate FET devices and the above prior art Schottky-barrier-gate silicon devices may exhibit acceptable gain-versus-frequency and cutoff frequency characteristics for certain applications, the cutoff frequency, $F_{max}$, of GaAs devices is limited by the carrier concentration and the epitaxial layer thickness which is reproducibly obtainable. In the case of silicon, the $F_{max}$ of these prior art silicon devices is limited by the carrier mobility and the scattering limited velocity of the layer into which the active FET device regions are formed.

THE INVENTION

The general purpose of this invention is to provide certain novel GaAs semiconductor devices and fabrication process therefor wherein active device regions are formed by introducing conductivity type determining impurities directly into semi-insulating GaAs substrates, without the requirements for initially growing a layer of epitaxial GaAs on the substrate. As a result of the elimination of the requirement for an N-type or P-type conductivity epitaxial layer, this novel process gives the device or integrated circuit designer a much greater flexibility than was heretofore available in the prior art. Thus, both P-type and N-type regions can be formed side by side in the semi-insulating GaAs substrate and electrically isolated by the substrate without the necessity for considering the conductivity type of a GaAs epitaxial layer. To attain this purpose, we have discovered a novel fabrication process which includes the implantation of sulphur ions directly into chromium doped high resistivity GaAs substrates in order to form GaAs semiconductor devices with improved operating characteristics. The devices include Schottky-barrier-gate field effect transistors with superior FET channel characteristics.

Contrary to the pre-existing belief that the combination of chromium doping and ion implantation would produce unacceptably low carrier mobilities in GaAs, it has been discovered that, in fact, chromium doped, sulphur ion implanted GaAs substrates exhibit suitably high carrier mobilities for GaAs device purposes. Such mobilities enable the fabrication of Schottky-barrier-gate FET's with cutoff frequencies, $F_{max}$, which are substantially higher than the $F_{max}$ of presently available state-of-the-art Schottky-barrier-gate devices. The specific reasons why such high carrier mobilities are obtainable by the use of our process are not completely understood. However, it is believed that the manufacturers of chromium doped substrates are now limiting and controlling the amounts of chromium which are utilized to raise the resistivity of the substrates to a semi-insulating value. Thus, with the relatively recent advent of sophisticated solid state GaAs displays and the very substantial increases in demands for millions of GaAs light emitting diodes each year, it is suspected that the manufacturers of chromium doped GaAs substrates are now carefully controlling the amounts of chromium utilized in GaAs substrate manufacture. This, in turn, controls the purity of the semi-insulating substrates now produced. Such GaAs semi-insulating substrates are also utilized, for example, in GaAs display devices to support and electrically isolate a large plurality of GaAs light emitting diodes in a single solid state display.

In any event, however, our discovery that these presently available semi-insulating GaAs substrates are indeed suitable for direct ion implantation to form GaAs devices is directly contrary to the hitherto generally accepted need for epitaxial processing techniques for forming these GaAs devices.

Accordingly, it is an object of the present invention to provide new and improved GaAs semiconductor devices in semi-insulating substrates.

A more specific object is to provide a Schottky-barrier-gate field effect transistor having a higher cutoff frequency, $F_{max}$, and an improved gain-versus-frequency characteristic relative to those corresponding characteristics exhibited by presently known state-of-the-art Schottky-barrier-gate FET's.

A further object is to provide a new and improved Schottky-barrier-gate FET of the type described whose transconductance, $g_m$, can be closely controlled in accordance with certain predetermined ion implantation parameters utilized in the device fabrication process.

A further object is to provide new and improved GaAs semiconductor devices having high carrier mobilities and extremely low leakage currents.

Yet another object of the invention is to provide a new and improved GaAs semiconductor device fabrication process which, relative to the prior art, eliminates the heretofore necessary and critical step of forming a GaAs epitaxial layer prior to ion implantation. This feature results in an increased device yield per wafer due to the improved uniformities in depth and distribution of carrier concentration of the electrically active ion implanted layer.

A still further object is to provide new and improved GaAs semi-insulating wafers with uniform electrically active layers therein. The carrier concentration of these layers may be carefully controlled using ion implantation techniques and these wafers per se may be marketed for further processing just like certain GaAs epitaxial wafers of the prior art.

These and other objects and features of the invention will become more readily apparent in the following description of the accompanying drawings.

DRAWINGS

Figure 7A:
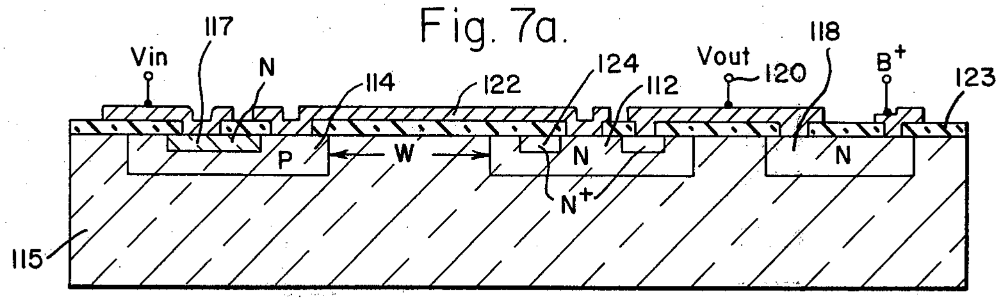
Figure 7B:
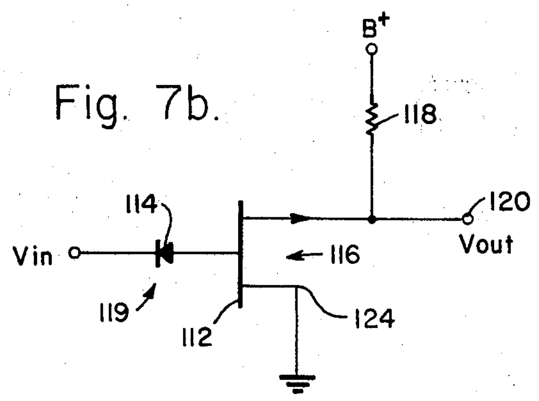

FIGS. 7*a* and 7*b* illustrate, in schematic cross-section and in schematic circuit diagram respectively, a typical electrically isolated GaAs integrated circuit which may be fabricated according to the ion implantation processes embodying the present invention.

DETAILED DESCRIPTION

Figure 1A:
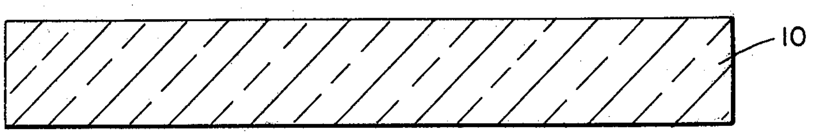
FIG. 1 illustrates, in schematic cross-section, a series of process steps utilized in fabricating an ion implanted wafer according to one embodiment of the invention.

Referring now to FIG. 1, there is shown in FIG. 1*a* a substrate 10 of semi-insulating GaAs material having a bulk resistivity in the range of $10^6$–$10^8$ ohm. centimeters. This high resistivity is achieved by doping the GaAs crystal from which the substrate 10 is sliced with chromium or oxygen, with such impurities being normally introduced into the melt from which the GaAs crystal is pulled. The fabrication of the GaAs substrate 10 per se does not form part of the present inventive process. Suitable GaAs substrates for use in practicing the present invention may be purchased from a number of suppliers, among which include the Sumitomo Corp. of Japan, The Electronic Materials Corp of Pasadena, California or The Texas Materials Lab. These substrates have an approximate chromium content on the order of 0.2 parts per million (less than $10^{16}$ chromium atoms/cc) and a bulk resistivity on the order of $10^8$ ohm. centimeters. For a further discussion of the fabrication of semi-insulating chromium-doped GaAs, reference may be made to U.S. Pat. No. 3,344,071. However, reference to this patent is not intended to suggest that any of the examples of the patent could or should be used in practicing the present process.

Figure 1B:
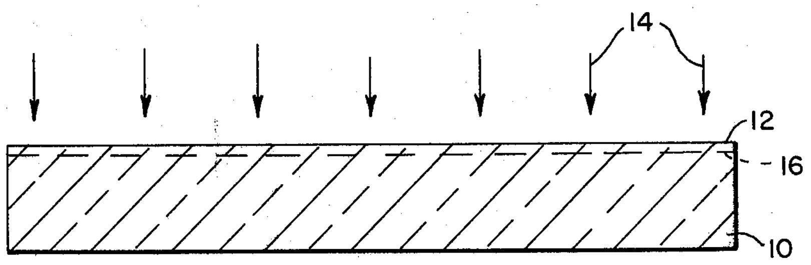

The substrate 10 is polished using conventional chemical polishing techniques in order to provide a smooth damage-free upper surface 12 into which sulphur $S^+$ ions 14 are projected. This step is accomplished by transferring the substrate 10 to a suitable ion implantation chamber wherein $S^+$ ions are accelerated into the substrate under the influence of accelerating potentials typically ranging from 20 to 200 KeV. Preferably, the sulphur implant process illustrated in FIG. 1*b* is carried out by first implanting sulphur ions at 20 KeV and at a dosage of $2 \times 10^{12}$ ions per square centimeter and thereafter increasing the accelerating voltage to 100 KeV and the ion dosage to $6 \times 10^{12}$ ions per square centimeter. Assuming a doping efficiency of 25%, this technique enables the formation of a thin sulphur implanted layer 16 having both a uniform thickness and uniform carrier concentration on the order of $10^{17}$ carriers per cubic centimeter over a depth of approximately 0.2 micrometers.

Figure 1C:
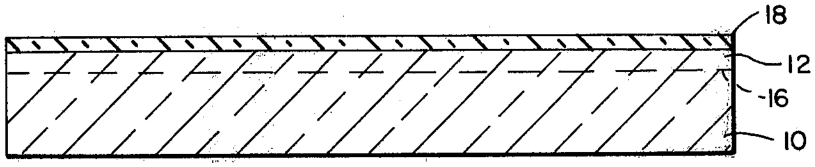

The wafer in FIG. 1*b* is then removed from the ion implantation chamber amd thoroughly cleaned in successive steps in HF, TCE, Acetone, and isopropyl alcohol, whereafter it is placed in a conventional SILOX oxide deposition system. The SILOX process is carried out in accordance with the following chemical reaction.

$$SiH_4 + O_2 \xrightarrow[\text{HEAT}]{380°C} SiO_2 + 2H_2$$

and in this process approximately 2000 Angstroms of $SiO_2$ are deposited on the $S^+$ implanted layer as shown in FIG. 1*c*. The latter step prevents disassociation of the GaAs and out-diffusion of the sulphur ions during a subsequent annealing step. This annealing step is subsequently carried out by transferring the oxide coated wafer shown in FIG. 1*c* to an anneal furnace wherein the temperature is elevated to approximately 800°C in a flowing forming gas (e.g. 90%$N_2$:10%$H_2$) atmosphere for approximately 20 minutes. This step serves to electrically activate the implanted sulphur atoms and to also anneal the implantation-caused lattice defects that would otherwise excessively reduce carrier mobilities in the structure.

Figure 2:
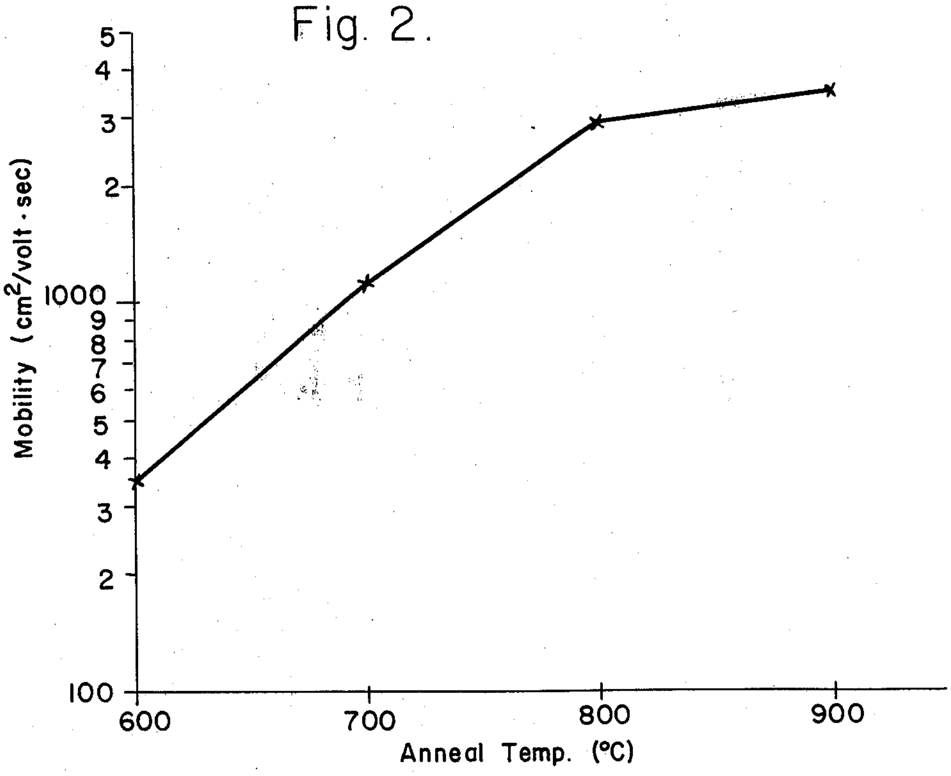
FIG. 2 is a graph of carrier mobility versus anneal temperature for the wafer shown in FIG. 1*c*.

The graph in FIG. 2 shows that as the anneal temperature for FIG. 1*c* is increased up to 800°C, there is a substantially-linear increase in the carrier mobility of the electrically activated sulphur implanted layer 16 out to approximately 800°C. At this point, the rate of increase of carrier mobility begins to taper off as shown between 800° and 900°C. It will be observed that at approximately 825°C, the carrier mobility crosses a level of 3000 $cm^2$/volt.second. Thus, the implanted wafer illustrated in FIG. 1*c* has manifest utility in and of itself, since these wafers may be sold to customers who prefer to begin their device processes with electrically implanted and activated GaAs starting materials.

EXAMPLE I

A Sumitomo GaAs semi-insulating wafer containing less than $10^{16}$ chromium atoms per cc was cleaned and polished and then implanted initially with $S^+$ ions at a dosage of $5 \times 10^{12}$ ions/cc at 30KeV and then again with $S^+$ ions at a dosage of $1 \times 10^{13}$ ions/cc at 150 KeV. Then the implanted GaAs substrate was oxidized as described above and annealed at 800°C for 20 minutes. Thereafter, we measured a carrier mobility in the implanted region of 3166 $cm^2$/volt.second.

Referring now to FIG. 3, there is illustrated an ion implantation process according to the invention wherein a GaAs integrated circuit resistor is fabricated in a semi-insulating GaAs substrate. As in the previous embodiment, the starting substrate material 20 is a chromium-doped GaAs substrate having a bulk resistivity of approximately $10^8$ ohm. centimeters and a chromium content on the order of 0.2 parts per million. The substrate 20 is initially polished using conventional chemical polishing methods such as those described above and thereafter a silicon dioxide ion implantation mask 22 is formed on the upper surface of the substrate 20. This ion implantation mask 22 is formed using standard photolighographic techniques wherein initially, a continuous layer of $SiO_2$ (not shown) is formed on the upper surface of the GaAs wafer 20. Thereafter a photoresist pattern (not shown) is formed atop the $SiO_2$ layer and has openings therein corresponding to the opening 24 in the $SiO_2$ layer in FIG. 3*b*. Hydrofluoric acid, HF, is then applied to the portions of the $SiO_2$ layer which are exposed by the resist pattern in order to create the opening 24 as the exposed $SiO_2$ is etched away by the HF. Then the photoresist mask is desolved away in a suitable solvent. These processing techniques are well-known in the art and will therefore not be described in further detail herein. An oxide thicknesses for the $SiO_2$ mask 22 on the order of 3000 Angstroms or greater will normally be sufficient to properly mask against the subsequent sulphur implantation step which is illustrated schematically in FIG. 3*c*. In this step, one or more sulphur implants are made into the masked structure as shown to cause the sulphur ions to penetrate the GaAs surface exposed by the opening 24 and form an implanted N type planar region 26, typically on the order of 2000 Angstroms in depth.

Figure 3A:
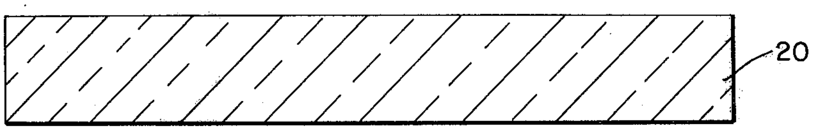
FIG. 3 illustrates, in schematic cross-section, a series of process steps utilized in the fabrication of an electrically isolated resistor according to another embodiment of the invention.
Figure 3B:
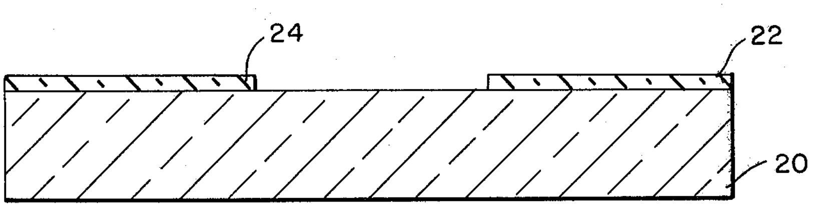
Figure 3C:
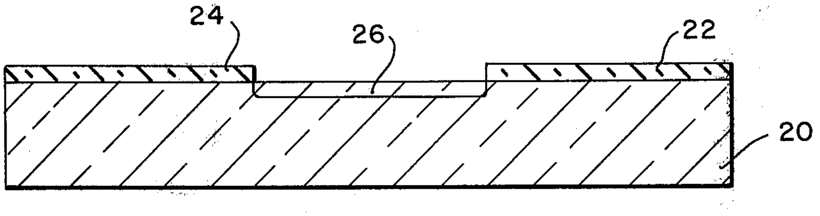
Figure 3D:
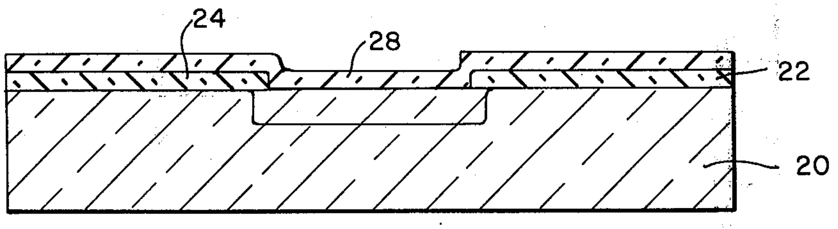

The structure in FIG. 3*c* is then transferred to an oxide coating system wherein, using the above-identified SILOX process, an additional layer 28 of $SiO_2$ is deposited on the upper surface of the structure as shown in FIG. 3*d*. Thereafter, the structure in FIG. 3*d* is transferred to an anneal furnace wherein it is annealed at approximately 800°C for approximately 20 minutes in order to electrically activate the implanted sulphur ions and to anneal out implantation-caused lattice defects that would otherwise excessively reduce carrier mobility in the implanted region 26.

Figure 3E:
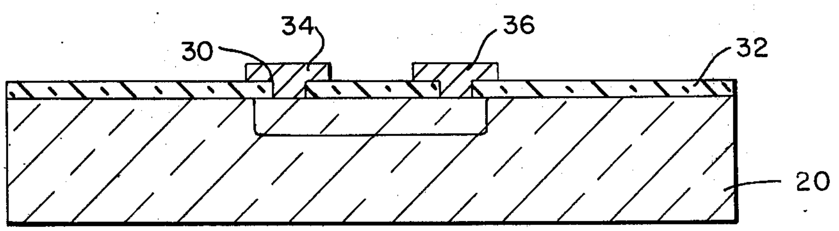

Openings 30 are then made in the remaining or a new surface oxide coating 32, and a pair of metal contacts 34 and 36 are deposited in these openings to make good ohmic contact to the sulphur implanted N type resistor 26. The $SiO_2$ layer 32 in FIG. 3*e* is shown as a continuous layer of but one thickness, but such layer 32 is intended as only a schematic illustration of this portion of the device. It may be merely the previously deposited layers 22 and 28 with appropriate openings made therein, or it may in fact be a newly deposited oxide layer.

Typically, the sulphur implanted resistor 26 has a carrier concentration of $1 \times 10^{16}$ carriers/cm$^3$, a thickness of about 0.1 micrometer, a length of about 1.0 millimeter and a width of about 0.1 millimeter. These dimensions yield an ohmic resistance of about 2.1 kilohms.

Referring now to FIG. 4, there is shown a double ion implantation process for forming a PN junction diode in a GaAs semi-insulating substrate. The chromium doped GaAs semi-insulating substrate starting material 40 is initially polished using conventional chemical polishing techniques such as those described above. Thereafter, an initial silicon dioxide mask 42 is formed on the surface of the GaAs wafer 40 using standard photolithographic photoresist masking and etching techniques which are well known in the art. The $SiO_2$ mask 42 has an opening 44 therein, and the original continous oxide layer from which the mask was formed was deposited using the above-identified SILOX process. The $SiO_2$ mask 42 is typically about 3000 A or greater in thickness. The structure in FIG. 4*b* is bombarded as shown with a beam of sulphur $S^+$ ions to form a first, N-type region 46, which is typically 0.5–0.75 micrometers in depth. This depth requires an ion acceleration potential in the 250–400 KeV range, and ion doses should be chosen to yield a uniform carrier concentration of typically $5 \times 10^{17}$/cm$^3$ (N-type). After this implantation step, a second $SiO_2$ mask 48 is formed on the upper surface of the implanted structure, as illustrated in FIG. 4*c*. The $SiO_2$ mask 48 has an opening 50 therein through which cadmium, $Cd^+$, ions are accelerated to form a second, P-type region 52 which extends typically to a depth on the order of 0.1 micrometers. The $Cd^+$ ion acceleration potential is typically 30 KeV, and ion doses should be chosen to yield a P type carrier concentration of typically $10^{18}$/cm$^3$. The second $SiO_2$ mask 48 need only be on the order of 1000 A in thickness for this $Cd^+$ implantation step. $Cd^+$ is a much heavier ion than $S^+$ and it will not penetrate the $SiO_2$ mask as deeply as the latter.

Figure 4A:
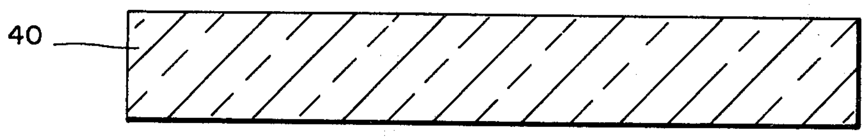
FIG. 4 illustrates, in schematic cross-section, a series of process steps utilized in the fabrication of a double implanted electrically isolated PN junction diode according to another embodiment of the invention.
Figure 4B:
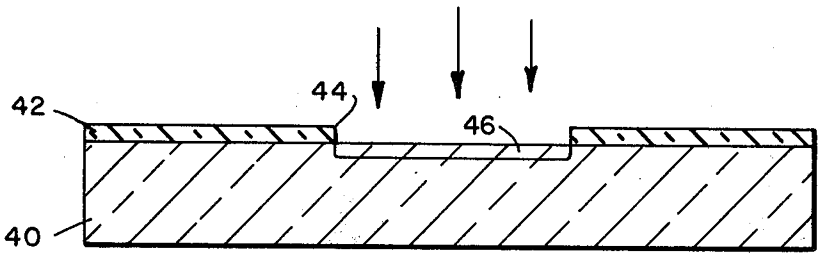
Figure 4C:
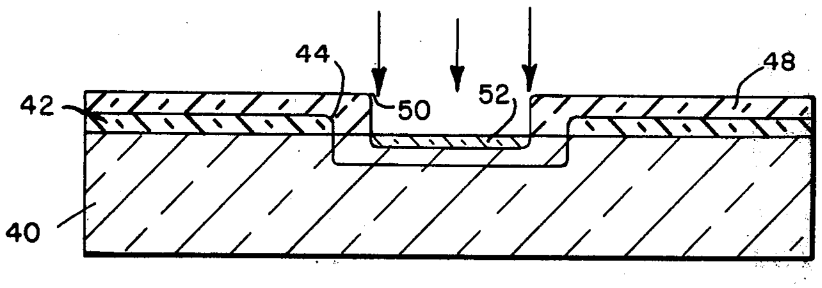
Figure 4D:
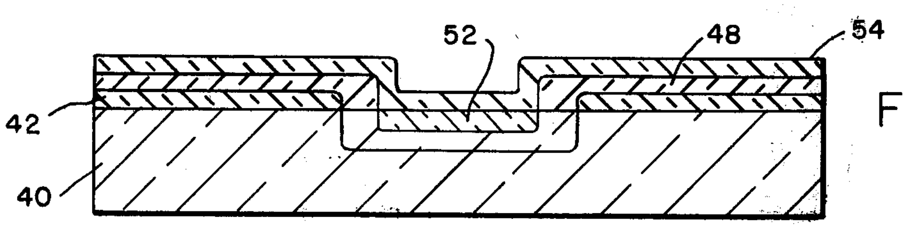

After the above-described multiple implantation steps have been completed, yet another passivating $SiO_2$ coating 54 is deposited as shown on the upper surface of the structure shown in FIG. 4*d*, and again the above described SILOX process is used for this oxide deposition step. The structure in FIG. 4*d* is then transferred to an anneal furnace wherein it is annealed at a temperature in the range of 800° to 900°C for approximately 20 minutes. During this anneal step, the N and P type regions 46 and 52 are driven somewhat deeper into the GaAs substrate 40. These regions are hereby electrically activated and simultaneously the ion implantation crystal damage is substantially annealed out of these two planar regions. This annealing can normally be expected to produce an activation of about 20% of the implanted $S^+$ ions and a mobility in the N type region of about 3000 cm$^2$/volt.second. Almost 100% of the $Cd^+$ ions can be expected to be activated by this annealaing, but the mobility may be as low as 100 cm$^2$/volt.second as a result of the low hole mobility in GaAs.

Next, openings 56 and 58 are made in the surface oxide mask remaining on the wafer in order to enable ohmic contacts 60 and 62 to be deposited on the surface areas of the two ion implanted regions 46 and 52 respectively. In this embodiment shown in FIG. 4, the contact 60 may be an annular contact which encircles a central button contact 62 for the simple PN junction diode fabricated.

Figure 4E:
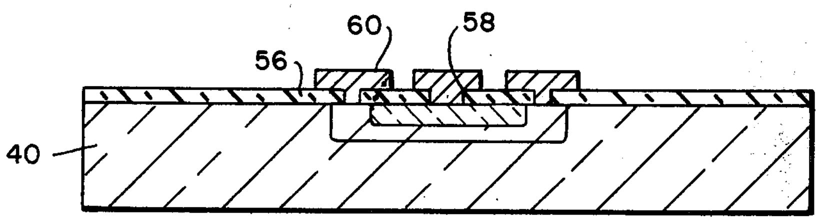

The wafer in FIG. 4*e* may then be diced to provide a large plurality of discrete diodes having the characteristics substantially identical to those of the particular planar diode described above. It is to be understood, of course, that all of the processes described herein are capable of being carried out as batch fabrication processes wherein a large plurality of devices are simultaneously fabricated on a single semi-insulative GaAs wafer.

The present process may also be utilized, as shown in FIG. 5, in the fabrication of a planar type Schottky-barrier diode. In this embodiment of the invention, a chromium doped GaAs semi-insulating substrate 64 having a resistivity in the range of $10^6$–$10^8$ ohm. centimeters is polished as previously described using conventional semiconductor processing techniques. Thereafter, an $SiO_2$ oxide mask 66 is formed on the surface of the GaAs substrate 64 using the above-identified SILOX process and standard photolighographic masking and etching procedures previously described. Thereafter, sulphur ions are implanted through the opening 68 in the $SiO_2$ mask 66 to thereby form an active N type Schottky diode region 70, which may be typically on the order of 1.0 micrometer in thickness. Such thicknesses, of course, may be closely controlled in accordance with the particular ion implantation accelerating voltages used. The above ranges of acceleration voltage, dosage carrier concentration and thickness for the N type region of the double implanted diode apply to the fabrication of this N type region.

Figure 5A:
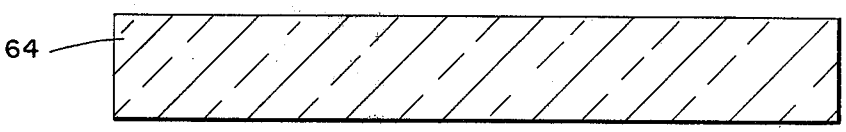
FIG. 5 illustrates, in schematic cross-section, a series of process steps utilized in the fabrication of a Schottky-barrier planar diode according to another embodiment of the invention.
Figure 5B:
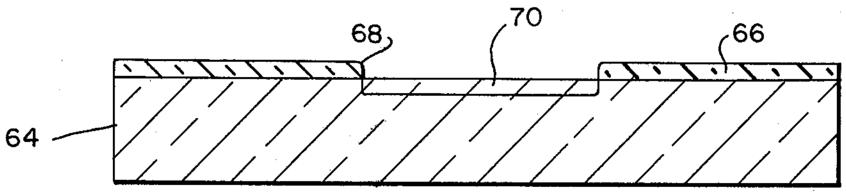
Figure 5C:
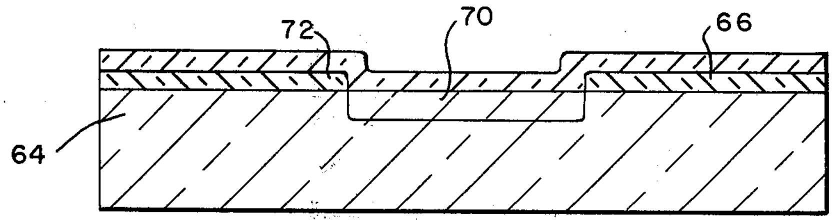
Figure 5D:
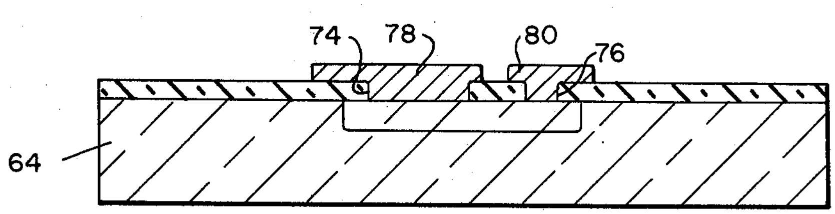

When the ion implantation step in FIG. 5*b* is completed, the structure in FIG. 5*b* is transferred to a SILOX deposition system wherein a passivating layer 72 of $SiO_2$ is formed on the exposed top surface of the structure and atop the sulphur implanted region 70 as shown in FIG. 5*c*. Thereafter, the structure in FIG. 5*c* is transferred to an anneal furnace wherein it is annealed at a temperature between 800° and 900°C for approximately 20 minutes in order to electrically activate the region 70 and anneal out the implantation damage therein.

The structure in FIG. 5*c* is then removed from the anneal furnace and transferred to a suitable oxide masking and etching station wherein openings 74 and 76 are made in the surface oxide layer 77 in order to permit the subsequent deposition of the aluminum Schottky-barrier electrode 78 and an ohmic contact electrode 80, the latter being a gold germanium alloy (88% gold and 12% germanium). The Schottky-barrier electrode 78 is formed by vapor depositing aluminum in the opening 74 at room temperatures. On the other hand, the gold-germanium contact electrode 80 is formed by alloying this electrode into the upper surface of the sulphur implanted region 70 at an alloy temperature of approximately 400°C for approximately 5 minutes. Since this latter temperature is not detrimental to the Al Schottky barrier, either the ohmic contact or the Schtokky barrier can be formed first in the above process sequence. As previously noted in the description of earlier embodiments, the oxide layer 77 is merely representative of the remaining oxide layers after the anneal step has been completed.

As is well-known, a Schottky-barrier is formed beneath the aluminum electrode 78, and this barrier is an abrupt rectifying junction which may be connected into any suitable circuit by the connection of appropriate wires or metalization strips to the upper surface of the device shown.

EXAMPLE II

Referring now to FIG. 6, there is illustrated a process whereby a novel Schottky-barrier-gate field effect transistor is fabricated. For the particular GaAs FET device which has been successfully reduced to practice, the GaAs chromium-doped substrate 82 had a bulk resistivity of $10^8$ ohm centimeters, a chromium concentration of at least $10^{16}$ atoms/cc and it was approximately 18 mils in thickness. The GaAs substrate 82 in FIG. 6*a* was initially placed in a Teflon etch basket and soaked in hydroflouric acid, HF, from between 3 and 5 minutes. Next the substrate 82 was rinsed in deionized water for approximately 5 minutes, whereafter it was removed to a hot acetone rinse and there left for approximately 15 seconds. This hot acetone rinse was maintained between 50° and 55°C. Next, the wafer 82 was placed in a hot solvent mixture of one-third trichloroethylene, one-third acetone, and one-third methanol for approximately 15 seconds. This latter rinse was maintained from between 50° and 55°C. Then the substrate 82 was again rinsed in hot 55°C acetone for approximately 15 seconds, whereafter it was transferred to a hot isopropyl alcohol bath at between 65° and 70°C where it was again rinsed. The wafer 82 was then scrubbed with a soft swab which had previously been immersed in isopropyl alcohol. Next, the wafer 82 was again rinsed in hot isopropyl alcohol at 70°C for approximately 1 minute, whereafter it was blown dry with filtered dry nitrogen and then allowed to bake in a furnace at approximately 140°C for a minimum of 1 hour.

Next, the above cleansed and chemically polished GaAs wafer 82 was placed in an ion implantation chamber maintained at room temperature and initially implanted at 20 keV with $2 \times 10^{12}$ sulphur atoms/cm$^2$ and then subsequently implanted at 100 keV with $6 \times 10^{12}$ sulphur atoms/cm$^2$. This double implantation process was utilized to produce a thin substantially uniform sulphur implanted layer 84 as shown in FIG. 6*b*, having a thickness on the order of 0.2 micrometers and a carrier concentration of approximately $10^{17}$/cm$^3$ for a doping efficiency of 25%.

Figure 6A:
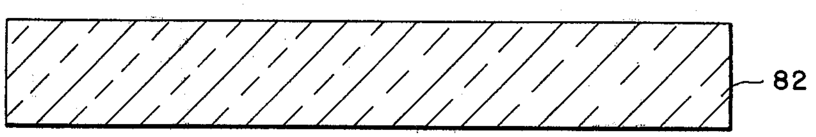
FIG. 6 illustrates, in schematic cross-section, a series of process steps utilized in the fabrication of a Schottky-barrier gate field effect transistor according to another embodiment of the invention.
Figure 6B:
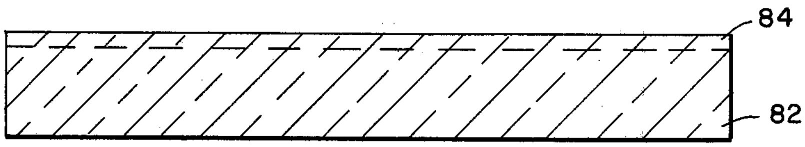

The wafer in FIG. 6*b* was then transferred to a SILOX oxide deposition system wherein a layer 86 of $SiO_2$ was deposited as shown on the upper surface of the structure, and this layer 86 prevents disassociation of the GaAs and out-diffusion of the sulphur ions during a subsequent anneal step. The structure in FIG. 6*c* was then transferred to an anneal furnace wherein it was annealed at a temperature of approximately 800°C in a flowing forming gas atmosphere ($90\%N_2$:$10\%H_2$) for approximately 20 minutes. This process activated the implanted sulphur atoms in layer 84 and annealed out the implantation-caused lattice defects that would otherwise have excessively reduced carried mobilities in the implanted layer 84.

Figure 6C:
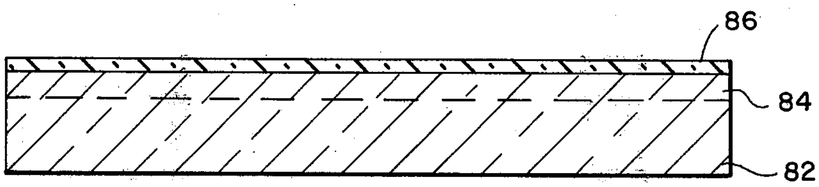
Figure 6D:
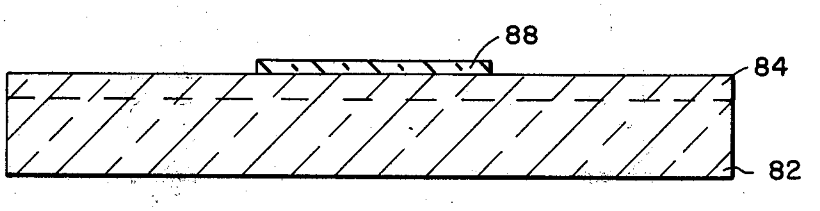
Figure 6E:
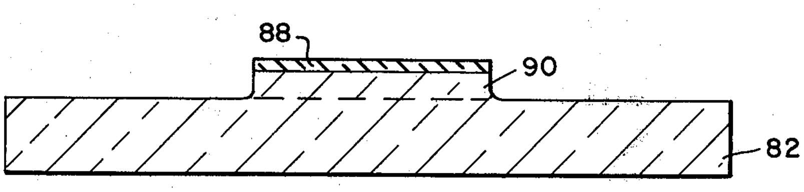
Figure 6F:
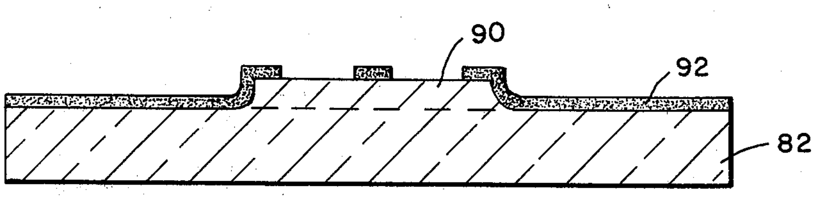

The wafer in FIG. 6*c* was then transferred to a conventional photoresist processing station where the $SiO_2$ layer 86 was removed from the wafer surface using HF and thereafter a photoresist mask 88 was formed on the upper surface of the GaAs wafer. Next, the wafer in FIG. 6*d* was subjected to a suitable GaAs etchant, such as a mixture of $N_aOH$ and $H_2O_2$, and this etchant removed the annular outer portion of the implanted layer 84, thereby leaving the mesa-like island region 90 as shown in FIG. 6*e*. In the GaAs wafers actually processed, these mesas 90 were approximately 300 micrometers wide and 0.5 micrometers high. Next, the photoresist mask 88 was removed from the mesa-etched structure in FIG. 6*e*, and thereafter a new photoresist masking pattern 92 was formed on the structure as shown in FIG. 6*f*.

Figure 6G:
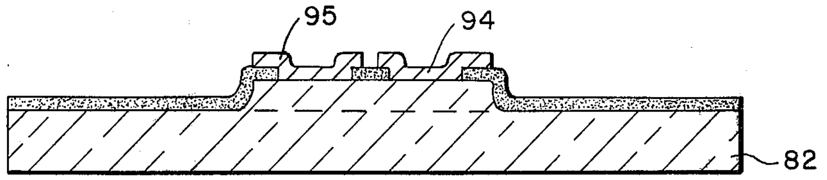
Figure 6H:
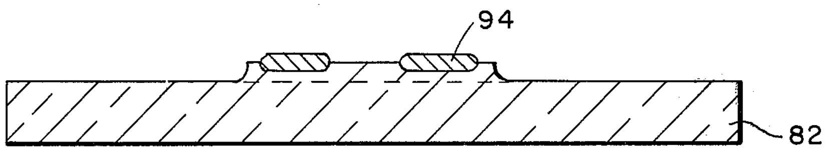

When the new photoresist mask 92 had dried sufficiently, a pair of ohmic contact metalization strips 94 and 95 of a gold-germanium and nickle coated alloy were deposited in the mask openings and on the upper surface of the structure shown in FIG. 6*g*. After the strips 94 and 95 were suitably adherent to the upper surface of the GaAs wafer, the photoresist pattern 92 was dissolved away from the upper surface of the wafer using a solvent soak etchant. The latter step left the gold-germanium source and drain contacts 94 and 95 intact as shown in FIG. 6*h*. The structure in FIG. 6*h* was then heated at approximately 400°C for approximately 1 minute in a flowing $90\%N_2$:$10\%H_2$ atmosphere in order to alloy the source and drain contacts into the surface of the N-type mesa island as shown in FIG. 6*i* These gold-germanium contacts 94 and 95 form an alloy bond with the mesa island 90, and actually become partially submerged below the surface of the N-type island 90 after the above heat-treating process.

Figure 6I:
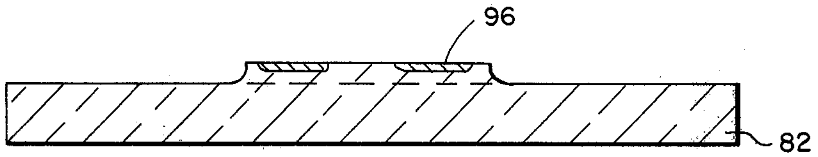
Figure 6J:
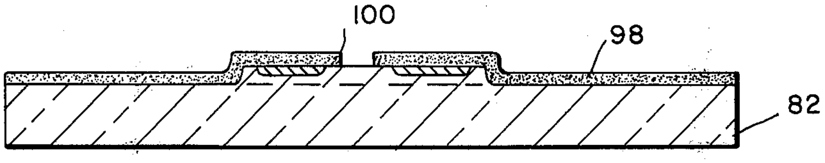

The wafer shown in FIG. 6*i* was then transferred to a standard photoresist processing station where another photoresist mask 98 shown in FIG. 6*j* was deposited on the wafer surface. The mask 98 has a central opening 100 therein for receiving a strip of aluminum gate metalization 102 which was was vapor deposited on the surface of the structure shown in FIG. 6*j* using standard aluminum evaporation techniques which are well-known in the art. After the aluminum strip 102 was suitably adherent to the N-type ion implanted channel region 90, the structure in FIG. 6*k* was transferred to a soak-solvent such as acetone, which dissolved away the photoresist mask 98, carrying with it the overlying portions of the aluminum metalization strip 102. This strip left intact the very narrow aluminum gate electrode 104 which was centered as shown between the source and drain contacts 94 and 95 in FIG. 6*k*. This aluminum gate electrode 104 was approximately 1800 Angstroms thick and had a gate length L of approximately 6 micrometers. Although the gate 104 was centered between source and drain contacts, it does not have to be centered for all device applications and may be instead offset with respect to the source in order to reduce the series resistance in the input signal path.

Figure 6K:
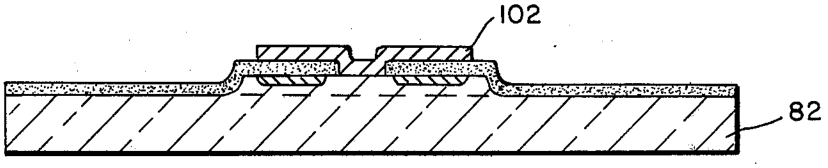
Figure 6L:
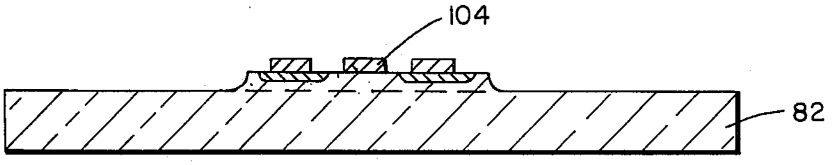

The GaAs wafer 82 in FIG. 6*l* was then diced using standard semiconductor processing techniques in order to form a plurality of Schottky-barrier-gate FETs identical to the particular FET shown in FIG. 6*k*. It is understood, of course, that the GaAs wafer 82 is batch processed in such a manner as to simultaneously form a large plurality of these FETs on a corresponding plurality of mesa island regions, e.g. 90, on the GaAs wafer 82.

Figure 6M:
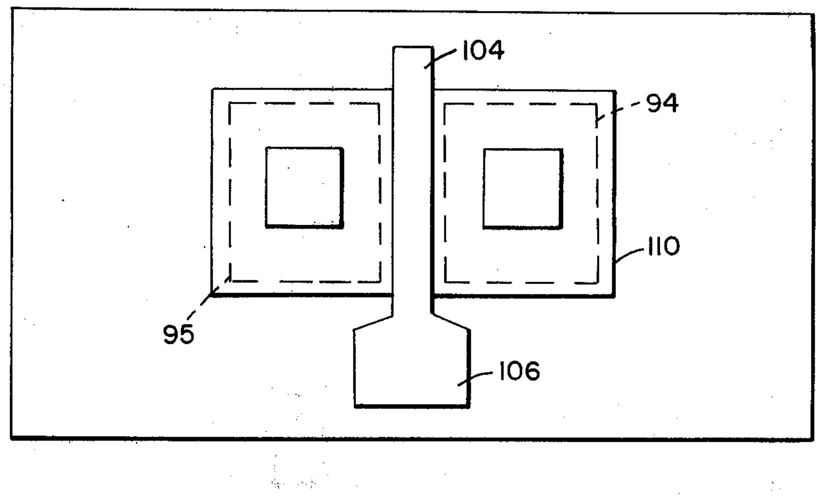

Referring now to FIG. 6*m*, the aluminum gate electrode 104 may advantageously consist of a very narrow strip which extends to an outer larger bonding pad 106 to which external control bias is applied. The dotted lines in FIG. 6*m* 94 and 95 represent the boundaries of the source and drain contacts which are actually beneath the surface of the mesa island 90 defined in this figure by its outer boundary 110.

Figure 6N:
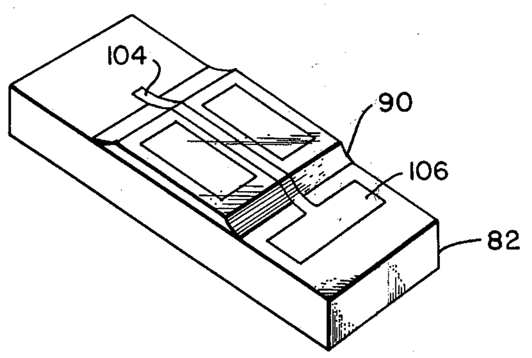

A three-dimensional view of a single Schottky-barrier-gate FET chip or die is shown in FIG. 6*n*. It will be observed that the gate metalization strip 104 extends into secure contact with the GaAs semi-insulating substrate 82 on both sides of the sulphur implanted island 90. The gate contact pad 106 is located on the portion of the semi-insulative substrate 82 which was exposed during the above described mesa etch step. This connection results in significantly lower gate capacitance and leakage current than can be obtained by using PN junction isolation techniques.

In accordance with the present invention, FETs have been fabricated with evaporated aluminum gates ranging from 2–6 micrometers in length ($L_g$) and with carrier concentrations in the N type channel region ranging from $8\times10^{16}/cm^3$ to $2\times10^{17}/cm^3$. At room temperature these devices have exhibited pinchoff voltages in the range of 1–4 volts, depending on the carrier concentration in the FET channel. Gate reverse-bias breakdown voltages have been measured at 15–20 volts, and leakage currents for gate voltages below pinchoff voltage have been measured at less than $10^{-9}$ amps. Gate-to-source capacitances were 0.5–1.5 pf, and DC transconductances have been measured as high as 25 micromohs for devices with a gate length $L_g = 2.3$ micrometers. The variation of transconductance from device to device over the surface of a 1.5 cm diameter wafer is typically $<\pm8\%$, and the variation in pinchoff voltage was $<\pm7\%$, which demonstrates the uniformity of thickness and carrier concentration in the ion implanted N-layer.

When the transistors were cooled to the 4°–10°K temperature range, relatively little change occured in their operating characteristics, except that gate leakage current was decreased to less than $10^{12}$ amps. This behavior was expected because $S^+$ dopant ions produce a very shallow energy level in GaAs ($\approx$0.002 eV below the conduction band). Hence, there is negligible carrier freezout even at 4°K. At temperatures below about 60°K, hysteresis loops in the output characteristics disappear, as carriers are "frozen" into the trapping states with detrapping times too long to allow response to the 120 Hz sweep frequency of the curve tracer used in testing these devices. This is significant because it suggests that these Schottky-gate devices can be used as amplifiers at cryogenic temperatures and at low frequencies without detrimental effects of the deep centers.

The high frequency characteristics of these ion-implanted GaAs FETs have also been examined. Transistors with a gate length $L_g$ = 2 micrometers were mounted on TO-51 headers, and the S parameters were measured in the 1–12 GHz range. These data indicated $F_{max}$ = 20 GHz for the best devices with $L_g$ = 2 micrometers. Maximum Available Gain (MAG) was equal to 22 dB at 1 GHz, and it decreased approximately 5 dB per octave increase in frequency up to 7 GHz. Above 7 GHz, MAG dropped off anomalously fast with increasaing frequency due to parasitic effects of the TO-51 header used and also due to the bonded gold wire device leads that were used. In a practical device application at frequencies above 7 GHz, a better approach would probably be to bond device chips directly into a matched strip-line amplifer circuit.

In conclusion, it has been demonstrated that GaAs Schottky-barrier-gate FETs can be fabricated by using direct ion-implantation-doping of Cr doped semi-insulating substrates to form the FET channel region. This process eliminates the difficult step of growing a sub micron thick epitaxial layer with a uniform thickness and carrier concentration over the wafer surface area. The presence of Cr atoms within the N-channel region does not appear to have any adverse effect on FET device performance. The implanted layer thickness and carrier concentration uniformity inherently produced by the ion implantation techniques used results in greater reproducibility of device operating characteristics and higher yields. This novel process also permits the fabrication of both P and N-channel FETs in the same GaAs wafer by selective masking prior to implantation, thus allowing complementary FET pairs to be fabricated in monolithic integrated circuits. In this latter process, a planar device geometry will be preferred to the mesa devices described above in FIG. 6.

Referring now to FIGS. 7*a* and 7*b*, there is shown a typical GaAs integrated circuit which may be fabricated according to the process of the present invention. It will be appreciated that the fabrication of the GaAs integrated circuit (IC) illustrated in FIG. 7 requires neither an epitaxial layer nor the conventional forms of IC isolation, such as PN junction isolation or dielectric isolation. This IC includes diode 114, FET 116 and resistor 118. In the integrated circuit of FIG. 7, the N-type region 112 may, for example, be the $S^+$ implanted channel region of a field effect transistor 116 illustrated schematically in FIG. 7*b*. The P-type implanted region 114, which is the anode of an IC diode 119, is separated from the FET channel region 112 by a small distance which is on the order of a few micrometers. The P-type region 114 of the diode 119 may be formed by implanting $Cd^+$ into the GaAs substrate 115, and the N region 117 of the diode 119 may be formed by implanting $S^+$ into the P region 114.

Diode 119 is typically utilized as an input threshold diode for the gate circuit of the FET 116 as shown in FIG. 7*b*, and the drain D of the field effect transistor 116 may, for example, be connected through an ion implanted resistor 118 to a $B^+$ power supply terminal 122. The output voltage of this FET threshold inverter is derived at the output terminal 120.

The metalization pattern 122 shown in FIG. 7*a* may be aluminum, which is deposited over the $SiO_2$ layer 123 using standard aluminum evaporation techniques. It will be appreciated that the schematic diagram in FIG. 7*a* is taken through only one plane cross-section of the complete integrated circuit represented schematically in FIG. 7*b*. At some suitable location on the IC wafer surface, it will be necessary to make another opening, (not shown) in the oxide layer 123 in order to make the proper and necessary electrical contact to the $N^+$ source region 124 of the field effect transistor 116. Such electrical contact will be made, of course, with metalization other than the metal strip 122.

Various other devices too numerous to describe herein may be manufactured according to the present novel process. Additionally, should N and P type ions other than $S^+$ and $Cd^+$ (e.g. Si) be later found suitable for implantation into semi-insulating GaAs to form active device regions with suitably high carrier mobilities, then such devices would fall within the scope of this invention. Finally, the above described novel process and devices made thereby are not limited by any specific amounts of chromium which should be used to dope the GaAs substrates and thus impact the high resistivity to same. For example, 0.25 parts per million (ppm) of Cr corresponds to an N-type residual carrier concentration in the GaAs of approximately $10^{16}$ carriers/cc, which is a relatively high purity GaAs crystal. However, it is possible to grow even purer GaAs crystals which have only $10^{15}$ residual N-type carriers/cc, and for these crystals only $10^{15}$ atoms/cc of Cr is required to compensate these carriers and make the GaAs crystal semi-insulating. In the latter case, only 0.025 ppm of Cr will be required to give $10^{15}$ atoms/cc of Cr in a GaAs crystal with approximately $4 \times 10^{22}$ total atoms.

And lastly, it is possible using present state of the art GaAs crystal growth techniques to obtain GaAs crystals having only 4 or 5 $\times 10^{14}$ N-type residual carriers/cc, and in order to adequately compensate the latter, only about 0.01 ppm of Cr will be required. Accordingly, it will be understood by those skilled in the art that the purity of the GaAs crystal will dictate the amount of Cr necessary, on a one-to-one basis, to compensate for the residual carrier concentration in the GaAs substrates.

What is claimed is:

1. A GaAs wafer comprising a GaAs semi-insulating substrate with a bulk resistivity between $10^6$ and $10^8$ ohm centimeters and having a thin ion implanted surface region therein, said region formed in a surface portion of said substrate and having a uniform thickness of about 0.2 micrometers or less over a predetermined area of said substrate, said ion implanted region characterized by an impurity concentration of at least $10^{17}$ carriers per cubic centimeter beginning at or closely adjacent the surface of said ion implanted region and extending over at least one half of its said thickness, and said ion implanted region further characterized by carrier mobilities therein in excess of 3000 cm²/volt-.second.

2. An ion implanted electrically isolated resistor comprising:

a. GaAs semi-insulating substrate having a bulk resistivity between $10^6$–$10^8$ ohm centimeters, b. a thin ion implanted surface region formed in a surface portion of said substrate and having a uniform thickness of about 0.2 micrometers or less over a predetermined area of said substrate, said ion implanted region characterized by an impurity concentration of at least $10^{17}$ carriers per cubic centimeter beginning at or closely adjacent the surface of said ion implanted region and extending over at least one half of its said thickness, and said region further characterized by carrier mobilities therein in excess of 3000 cm²/volt.second; and c. spaced-apart metal contacts on said ion implanted region for making ohmic connection to said resistor.

3. An electrically isolated double implanted diode comprising:

a. a GaAs substrate having a bulk resistivity in the range of $10^6$–$10^8$ ohm centimeters, b. an N-type ion implanted region, formed in a surface portion of said substrate and having a uniform thickness of about 0.2 micrometers or less over a predetermined area of said substrate, said ion implanted region characterized by an impurity concentration of at least $10^{17}$ carriers per cubic centimeter beginning at or closely adjacent the surface of said ion implanted region and extending over at least one half of its said thickness, and said region further characterized by carrier mobilities therein in excess of 3000 cm²/volt.second, c. a P-type ion implanted region bounded by said N-type region and defining therewith a PN junction, d. a surface passivating coating covering said PN junction and having openings therein, and e. metal contacts in said openings for applying bias to said PN junction.

4. An electrically isolated Schottky-barrier diode comprising:

a. a GAAs semi-insulating substrate having a bulk resistivity in the range of $10^6$–$10^8$ ohm centimeters and being doped with chromium in excess of 0.01 parts per million, b. said GaAs substrates including therein an N-type ion implanted and electrically activated region formed in a surface portion of said substrate and having a uniform thickness of about 0.2 micrometers or less over a predetermined area of said substrate, said ion implanted region characterized by an impurity concentration of at least $10^{17}$ carriers per cubic centimeter beginning at or closely adjacent the surface of said ion implanted region and extending over at least one half of its said thickness, and said region further characterized by carrier mobilities therein in excess of 3000 cm²/volt-.second, c. a Schottky-barrier contact bonded at one selected area of said implanted region and forming therewith a Schottky-barrier junction, and d. an ohmic contact bonded to another selected area of said implanted region.

5. The diode in claim 4 wherein said N-type region is sulfur ion implanted at an ion dosage of between $10^{11}$/cm² and $10^{14}$/cm².

6. A Schottky-barrier-gate field effect transistor comprising:

a. a semi-insulating GaAs substrate having a resistivity in the range of $10^6$–$10^8$ ohm centimeters, b. an ion implanted N-channel region selectively formed in a surface portion of said substrate and having a uniform thickness of about 0.2 micrometers or less over a predetermined area of said substrate, said ion implanted region characterized by an impurity concentration of at least $10^{17}$ carriers per cubic centimeter beginning at or closely adjacent the surface of said ion implanted region and extending over at least one half of its said thickness, and said region further characterized by carrier mobilities therein in excess of 3000 $cm^2$/volt-.second, c. spaced-apart ohmic contacts formed on the surface of said ion implanted N-channel region to thereby form source and drain electrodes for said Schottky-barrier-gate field effect transistor, and d. a thin strip of metallization located between said source and drain electrodes and in intimate contact with said ion implanted region, whereby gate voltages applied to said gate electrode are operative to control the conductivity in said ion implanted N-channel region between said source and drain electrodes of said transistor, and the capacitive coupling from said channel region through said substrate is minimized.

7. The device defined in claim 6 wherein said N-channel region is sulfur ion, $S^+$, implanted with a relatively uniform carrier concentration over a thickness of between 0.1–0.2 micrometers.

8. The device defined in claim 6 wherein said N-channel region has a mesa configuration and is integral with said semi-insulating substrating which serves to electrically isolate said transistor from other components or devices on or in said substrate.

* * * * *